United States Patent
Saitoh et al.

(10) Patent No.: US 9,930,790 B2
(45) Date of Patent: Mar. 27, 2018

(54) METHOD FOR MANUFACTURING MULTILAYER SUBSTRATE FOR HAVING BGA-TYPE COMPONENT THEREON

(71) Applicant: DENSO CORPORATION, Kariya, Aichi-pref. (JP)

(72) Inventors: Hirokazu Saitoh, Kariya (JP); Ichiro Yoshida, Takahama (JP)

(73) Assignee: DENSO CORPORATION, Kariya (JP)

(*) Notice: Subject to any disclaimer, the term of this patent is extended or adjusted under 35 U.S.C. 154(b) by 265 days.

(21) Appl. No.: 14/762,899

(22) PCT Filed: Jan. 14, 2014

(86) PCT No.: PCT/JP2014/000123
§ 371 (c)(1),
(2) Date: Jul. 23, 2015

(87) PCT Pub. No.: WO2014/119232
PCT Pub. Date: Aug. 7, 2014

(65) Prior Publication Data
US 2015/0366080 A1 Dec. 17, 2015

(30) Foreign Application Priority Data

Jan. 30, 2013 (JP) .............................. 2013-015446
Oct. 18, 2013 (JP) .............................. 2013-217304

(51) Int. Cl.
*H05K 3/40* (2006.01)
*H05K 3/28* (2006.01)
(Continued)

(52) U.S. Cl.
CPC ......... *H05K 3/4038* (2013.01); *H05K 1/0216* (2013.01); *H05K 3/0079* (2013.01);
(Continued)

(58) Field of Classification Search
CPC ...... H05K 3/46; H05K 3/4605; H05K 3/4632; H05K 2201/09072; H05K 2201/099;
(Continued)

(56) References Cited

U.S. PATENT DOCUMENTS 6,303,878 B1 10/2001 Kondo et al.
6,376,052 B1 * 4/2002 Asai ..................... H05K 3/0094
174/255

(Continued)

FOREIGN PATENT DOCUMENTS

JP H02-294095 A 12/1990
JP H04-097588 A 3/1992
(Continued)

OTHER PUBLICATIONS

International Search Report and Written Opinion of the International Searching Authority dated Mar. 4, 2014 issued in the corresponding International application No. PCT/JP2014/000123 (and English translation).

*Primary Examiner* — Carl Arbes
(74) *Attorney, Agent, or Firm* — Posz Law Group, PLC

(57) ABSTRACT

In a method for manufacturing a multilayer substrate for having a BGA-type component thereon, a conductive through hole for restricting a signal interference and a resist film are formed on the multilayer substrate, an occurrence of a fault caused by a residual of a resist in the conductive through hole is reduced. In the method for manufacturing the multilayer substrate for having the BGA-type component thereon, a step of forming the resist film includes an applying step of applying a photosensitive resist to an entirety of a front surface portion of a base. The applying step is performed while restricting the resist from entering the conductive through hole by supplying a high pressure air to (Continued)

a rear surface of the base to pass through the conductive through hole using an air supply mechanism.

6 Claims, 14 Drawing Sheets

(51) Int. Cl.
*H05K 1/02* (2006.01)
*H05K 3/00* (2006.01)
*H05K 3/46* (2006.01)
*H05K 3/34* (2006.01)

(52) U.S. Cl.
CPC ............. *H05K 3/28* (2013.01); *H05K 3/3452* (2013.01); *H05K 3/46* (2013.01); *H05K 3/3436* (2013.01); *H05K 2201/099* (2013.01); *H05K 2201/09072* (2013.01); *H05K 2201/10674* (2013.01); *H05K 2203/0594* (2013.01); *H05K 2203/081* (2013.01); *H05K 2203/1581* (2013.01); *Y10T 29/49126* (2015.01)

(58) Field of Classification Search
CPC . H05K 2201/10674; H05K 2203/0594; H05K 2203/081; H05K 2203/1581; H01K 1/0216; H03K 3/0079; H03K 3/28; H03K 3/3436; H03K 3/3452; H03K 3/4038; H03K 3/46; Y10T 29/49126
See application file for complete search history.

(56) References Cited

U.S. PATENT DOCUMENTS

| 7,129,158 B2 * | 10/2006 | Nakai | ................... C23C 18/54 257/678 |
| 7,679,004 B2 * | 3/2010 | Fukase | ................. H05K 1/116 174/262 |

FOREIGN PATENT DOCUMENTS

| JP | H04-215493 | A |   | 8/1992 |
| JP | 2000124618 | A | * | 4/2000 |
| JP | 2000-277892 | A |   | 10/2000 |
| JP | 2001-156203 | A |   | 6/2001 |
| JP | 20011177250 | A | * | 6/2001 |
| JP | 2001-339144 | A |   | 12/2001 |
| JP | 2002-190664 | A |   | 7/2002 |
| JP | 2003-332720 | A |   | 11/2003 |
| JP | 3546457 | B2 | * | 7/2004 |
| JP | 2005-045152 | A |   | 2/2005 |
| JP | 2006-202881 | A |   | 8/2006 |
| JP | 2011-060875 | A |   | 3/2011 |
| JP | 2011-142185 | A |   | 7/2011 |

* cited by examiner

FIG. 2
(a) 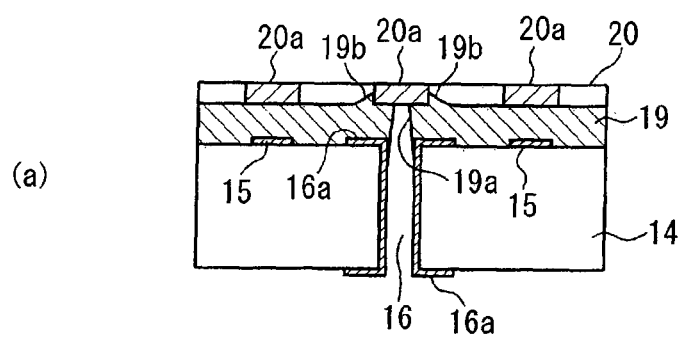
(b) 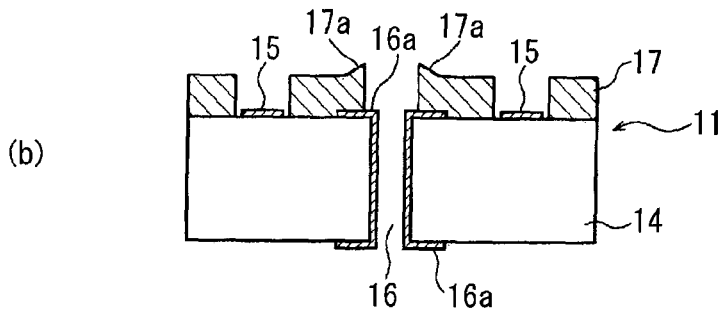
(c) 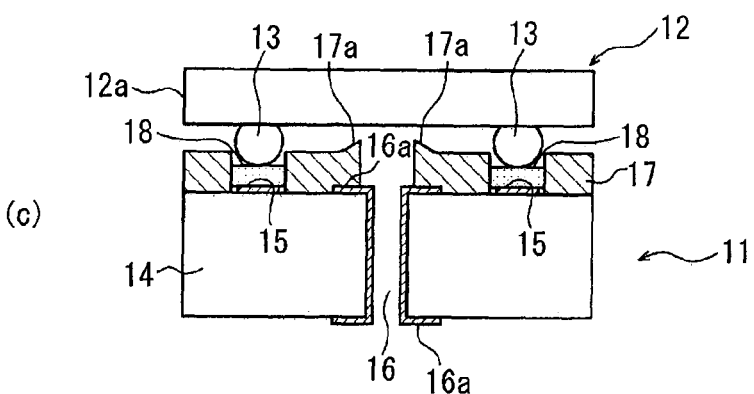

FIG. 10
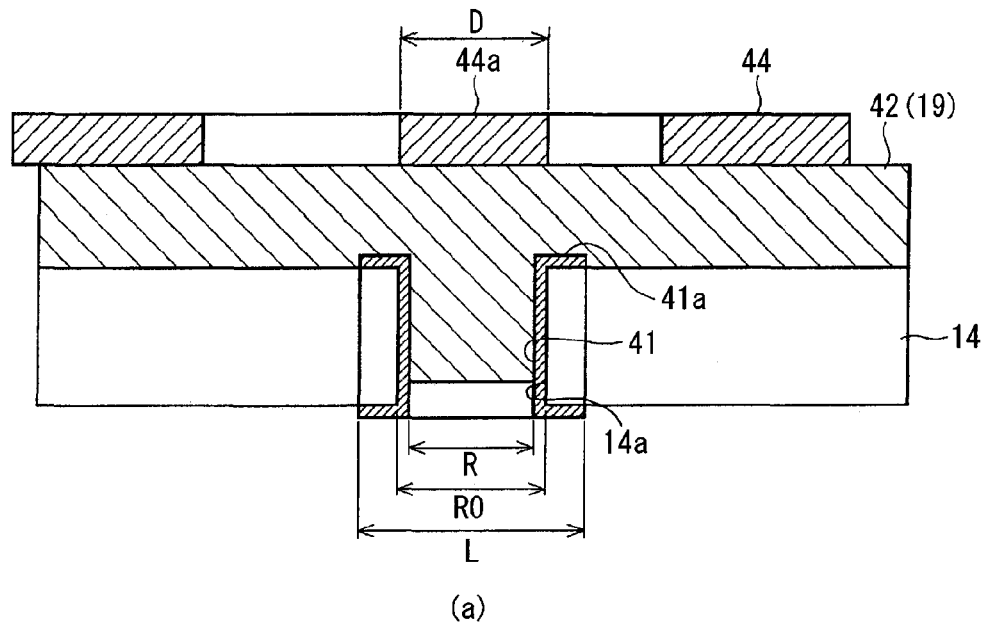
(a)
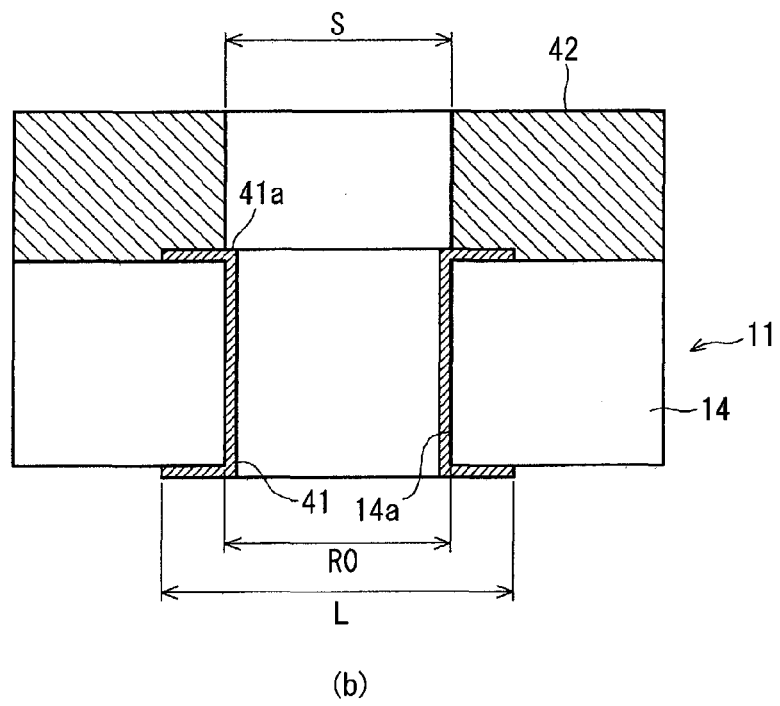
(b)

FIG. 13
RELATED ART
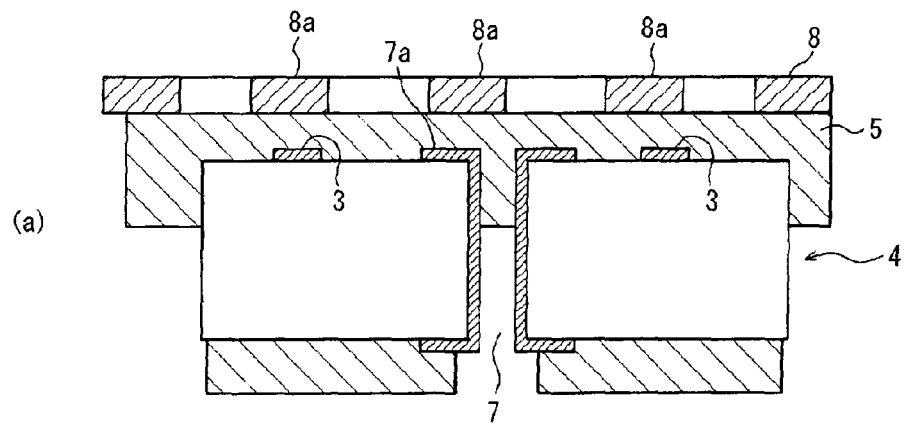
(a)
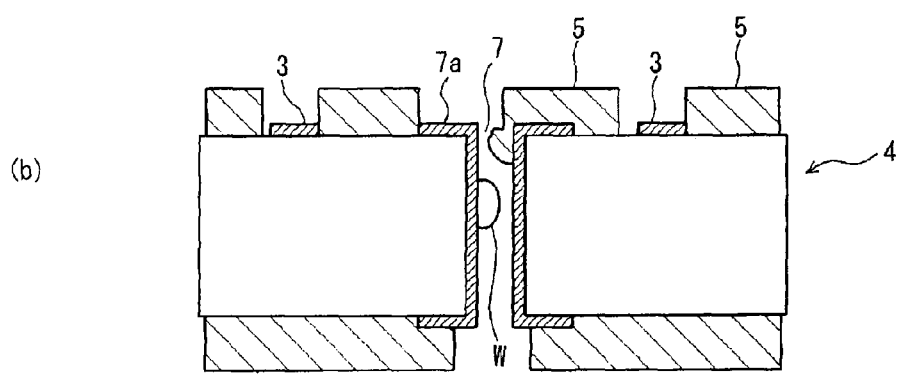
(b)

METHOD FOR MANUFACTURING MULTILAYER SUBSTRATE FOR HAVING BGA-TYPE COMPONENT THEREON

CROSS REFERENCE TO RELATED APPLICATIONS

This application is U.S. national phase of International Patent Application No. PCT/JP2014/000123 filed on Jan. 14, 2014 and is based on Japanese Patent Applications No. 2013-15446 filed on Jan. 30, 2013 and No. 2013-217304 filed on Oct. 18, 2013, the disclosures of which are incorporated herein by reference.

TECHNICAL FIELD

The present disclosure relates to a method for manufacturing a multilayer substrate for having a BGA-type component thereon, the method including forming of plural conductive through holes for restricting a signal interference in a base that has an insulation property, the conductive through holes passing through the base from a front surface to a rear surface between lands.

BACKGROUND ART

A BGA (Ball Grid Array)-type package is generally used for a package of a semiconductor component, for example, a CPU (processor). As shown schematically in FIG. 12(b), this kind of BGA-type component (CPU) 1 has plural ball shaped solder bumps 2 arrayed in a grid on a mounting surface (lower surface) of a package 1a. As also shown in FIG. 12(a), FIGS. 13(a), (b) and FIGS. 14(a), (b), a multilayer substrate 4 having plural lands 3 corresponding to the solder bumps 2 at a front surface portion thereof is used for mounting the BGA-type component 1 thereon.

In general, a soldering step called reflow is known to be performed for mounting the semiconductor component on the substrate (for example, see patent literatures 1 and 2). As described in the patent literature 1, a portion of a front surface of the multilayer substrate 4 other than the lands 3 is covered with a resist film 5 (see FIG. 12(b)). In the reflow step, a soldering paste 6 is applied only to the lands 3 of the multilayer substrate 4. Then, the solder bumps 2 of the BGA-type component 1 are placed on the soldering paste 6 on the lands 3 and heated under temperature control. Thus, the multilayer substrate 4 and the BGA-type component 1 are connected.

Recently, because of a development of a semiconductor technology, a rapid improvement of an operating speed of a large-scale integration (LSI) and an acceleration of a transmission rate of handled data are attempted and an operating speed of a CPU is accelerated. Therefore, a high frequency signal in a gigahertz level is transmitted between the CPU and a memory or between the CPU and a device connected with the CPU. However, due to a nature of an electromagnetic wave, the high frequency signal in the gigahertz level causes a signal reflection at an end of a wiring and a leakage of the electromagnetic wave to an adjacent wiring. As a result, the operation of the CPU is unstable.

To solve such drawbacks, it is preferable to make the length of the signal lines between devices uniform or to separate the signal lines from the adjacent wirings completely. However, it is difficult to separate the wirings when an information processing device is miniaturized. In order to transmit the high frequency signal surely in the wiring connecting the CPU and an element, it is effective to form the signal line expanding three-dimensionally in a plate thickness direction of the multilayer substrate, and ideally, to dispose a conducting plane (shield) like a wall, or a ground wire surrounding the signal line. On a manufacturing process of the multilayer substrate, however, it is considered to be difficult to dispose the conductive plane and the ground wire surrounding the signal line.

As an alternative of the conducting portion (shield), as shown in FIG. 12(a) to FIG. 14(b), a conductive through hole 7 is formed in the multilayer substrate 4 between the lands 3 to which the CPU 1 is soldered to restrict a signal interference between the signal lines. The conductive through hole 7 is provided with circular through hole lands 7a at both an upper surface and a lower surface of the multilayer substrate 4 and a copper plating formed on an inner surface of a through hole connecting the through hole lands 7a on the upper and lower surfaces of the multilayer substrate 4. The conductive through hole 7 has, for example, a ground potential. Currently, as shown in FIG. 12(a), the multilayer substrate in which a distance a between centers of the lands 3 in vertical and horizontal directions is around 0.8 mm is generally used, and the inner diameter R of the thorough hole 7 is, for example, around 0.3 mm.

PRIOR ART LITERATURE

Patent Literature

Patent Literature 1: JP 2001-156203A
Patent Literature 2: JP 2011-142185A

SUMMARY OF INVENTION

As shown in FIG. 13(a), for forming of the resist film 5 at a front surface portion of the multilayer substrate 4, a step of applying a photosensitive resist 5 in an unhardened state to an upper surface of the multilayer substrate 4 is performed, and then an exposing step of exposing the applied resist 5 having a photo mask 8 thereon is performed. In this time, the photo mask 8 has shielding portions 8a that shield light at positions to correspond to the lands 3 and the through holes 7. In the exposing step, a portion of the resist 5 that is exposed to the light is hardened and a portion of the resist 5 that is not exposed remains unhardened. In a next washing step, the unhardened portion of the resist 5 is washed and removed with a washing liquid (solvent) W. As a result, the resist film 5 that covers a required portion of the multilayer substrate 4 is formed.

However, if the photo mask 8 is displaced on the resist 5, the hardened resist 5 will remain in the through hole 7 (FIG. 13(a) illustrates a state where the photo mask 8 is displaced in a leftward direction). If the resist 5 remains in the through hole 7 to close a portion (or an entirety) of the through hole 7, the washing liquid W used in the washing step remains in the through hole 7, as shown in FIG. 13(b). Thereafter, when the through hole 7 is heated in a reflow step, copper is oxidized by the washing liquid. Namely a disconnection occurs in the through hole 7. As a result, a fault that a conductive state of the through hole 7 is lost (the through hole 7 does not work to restrict a signal interference) occurs.

To solve the fault described above, as shown in FIG. 14(a), it is considered to increase a diameter of a circular portion of the light-shielding portion 8a of the photo mask 8 covering the upper portion of the through hole 7, for example, to cover the entirety of the through hole land 7a (i.e., to make larger than an outer diameter L of the through hole land 7a). In this case, the resist 5 will not be hardened (remain) in the through hole 7, and will be washed and removed completely.

However, when an opening portion of the resist film 5 on the through hole 7 is enlarged, as shown in FIG. 14(b), a portion of the resist film 5 that separates the land 3 and the through hole 7a becomes small (short) due to the land 3 and the through hole land 7a being disposed nearer. Therefore, the solder will move as shown by an arrow in FIG. 14(b). As a result, as shown in FIG. 12(a), a connection failure (a short called as a solder bridge 9) where the land 3 and the through hole 7a is connected through the solder will occur.

The patent literature 2 describes to arrange a projected barrier wall between the adjacent lands on an upper surface portion of the multilayer substrate in order to prevent the solder bridge between the adjacent lands. However, the patent literature 2 does not disclose a method of forming such fine projection on the substrate in detail, and a possibility of such technique is quite low. Even if the projected barrier wall can be formed on the substrate, time and costs thereof are thought to be quite large.

It is an object of the present disclosure to provide a method for manufacturing a multilayer substrate for having a BGA-type component thereon, the method including forming a conductive through hole for restricting a signal interference and forming a resist film on the multilayer substrate on which the BGA-type component is to be mounted, and is capable of reducing an occurrence of a fault caused by a residual of a resist in the conductive through hole.

According to a first aspect of the present disclosure, a method for manufacturing a multilayer substrate for having a BGA-type component thereon includes: forming a plurality of lands to which the BGA-type component is to be soldered in an aligned state at a front surface portion of a base that has an insulation property; forming a plurality of conductive through holes for restricting a signal interference to pass through the base from a front surface to a rear surface between the lands; and forming a resist film to cover a portion of the front surface portion of the base other than each land and each conductive through hole. A step of forming the resist film includes: an applying step of applying a photosensitive resist to an entirety of the front surface portion of the base; an exposing step of exposing and hardening the resist in a state where a photo mask that shields a portion where the resist film is not formed is disposed adjacent to the front surface of the base; and a washing step of removing an unhardened portion of the resist. The applying step is performed while restricting the resist from entering the conductive through hole by supplying a high pressure air to the rear surface of the base to pass through the conductive through hole using an air supply mechanism.

Accordingly, in the step of forming the resist film at the front surface portion of the multilayer substrate, the applying step of applying the photosensitive resist to the entirety of the front surface portion of the base is performed while restricting the resist from entering the conductive through hole by supplying the high pressure air to the rear surface of the base to pass through the conductive through hole using the air supply mechanism. Therefore, irrespective of a displacement of the photo mask, the applying step can be finished in a state where the resist does not remain (enter) in the conductive through hole, and the following exposing step and washing step can be performed. As a result, an occurrence of a fault caused by a residual of the resist in the conductive through hole can be reduced, in the method for manufacturing the multilayer substrate for having the BGA-type component mounted thereon, and in which the conductive through hole for restricting the signal interference is formed and the resist film is formed.

According to a second aspect of the present disclosure, a method for manufacturing a multilayer substrate for having a BGA-type component thereon includes: forming a plurality of lands to which the BGA-type component is to be soldered in an aligned state at a front surface portion of a base that has an insulation property; forming a plurality of conductive through holes for restricting a signal interference to pass through the base from a front surface to a rear surface between the lands; and forming covering resist film to cover a portion of the front surface portion of the base other than each land and conductive through hole. A step of forming the resist film includes: an applying step of applying a photosensitive resist to an entirety of the front surface portion of the base; an exposing step of exposing and hardening the resist in a state where a photo mask that shields a portion where the resist film is not formed is disposed adjacent to the front surface of the base; and a washing step of removing an unhardened portion of the resist. A circular light-shielding portion of the photo mask covering a front surface portion of the conductive through hole is formed to have a diameter D that allows a dimension X of an uncovered portion of the conductive through hole in a direction along a diameter of the conductive through hole to be equal to or less than 10% of an inner diameter R of the conductive through hole, even if the photo mask is displaced from the base by a maximum allowable range.

According to experiments and studies by inventors of the present disclosure, a washing liquid remains in the conductive through hole and then a disconnection of the conductive through hole occurs in a reflow step, when a length of an over resist, that is, the resist closing an opening portion of the conductive through hole is greater than 10% of the inner diameter R of the conductive through hole. In contrast, a residual of the washing liquid does not occur when an over resist length is kept equal to or less than 10% of the inner diameter R. Hence, a fault of the disconnection of the conductive through hole can be restricted by forming the circular light-shielding portion of the photo mask to have the diameter D that allows the dimension X of the uncovered portion of the conductive through hole in the direction along the diameter of the conductive through hole to be equal to or less than 10% of the inner diameter R of the conductive through hole, even if the photo mask is displaced from the base by the maximum allowable range. Therefore, according to the construction described above, an occurrence of the fault caused by the residual of the resist in the conductive through hole can be reduced, in the method for manufacturing the multilayer substrate for having the BGA-type component mounted thereon in which the conductive through hole for restricting the signal interference is formed and the resist film is formed.

According to a third aspect of the present disclosure, a method for manufacturing a multilayer substrate for having a BGA-type component thereon includes: forming a plurality of lands to which the BGA-type component is to be soldered in an aligned state at a front surface portion of a base that has an insulation property; forming a plurality of conductive through holes for restricting a signal interference to pass through the base from a front surface to a rear surface between the lands by forming a plurality of through holes in the base and then forming a plating with a predetermined thickness on each of the through holes; and forming covering resist film to cover a portion of the front surface portion of the base other than each land and each conductive through hole A step of forming the resist film includes: an applying step of applying a photosensitive resist to an entirety of the front surface portion of the base; an exposing step of exposing and hardening the resist in a state where a photo mask that shields a portion where the resist film is not formed is disposed adjacent to the front surface of the base; and a washing step of removing an unhardened portion of the resist. A circular light-shielding portion of the photo mask covering a front surface portion of the conductive through hole is formed to have a diameter D that allows a diameter S of an opening portion of the resist film at the front surface portion of the conductive through hole to be equal to or less than an inner diameter R0 of the through hole.

According to the construction described above, the opening portion of the resist film at the front surface portion of the conductive through hole will be small enough, and most of the land of the conductive through hole at the front surface portion of the base is covered with the resist film. Therefore, a portion of the resist film that extends between the land to which the BGA-type component is soldered and the through hole land can be secured larger (longer). As a result, a solder bridge caused by a solder on the land extending to and connecting to the through hole land can effectively be restricted.

BRIEF DESCRIPTION OF DRAWINGS

The above and other objects, features and advantages of the present disclosure will become more apparent from the following detailed description made with reference to the accompanying drawings, in which:

FIGS. 2(a) to (c) are enlarged vertical cross-sectional views of a main portion for sequentially illustrating steps after the applying step;

FIG. 10(a) is an enlarged vertical cross-sectional view of a main portion schematically illustrating a state where a photo mask is disposed adjacent to a mounting surface of a base;

FIG. 10(b) is an enlarged vertical cross-sectional view illustrating a resist film formed on the base;

FIGS. 13(a) and (b) are vertical cross-sectional views schematically illustrating a state where a resist remains in a conductive through hole when a photo mask is displaced on the base, as a related art.

DESCRIPTION OF EMBODIMENTS

First Embodiment

Figure 1:
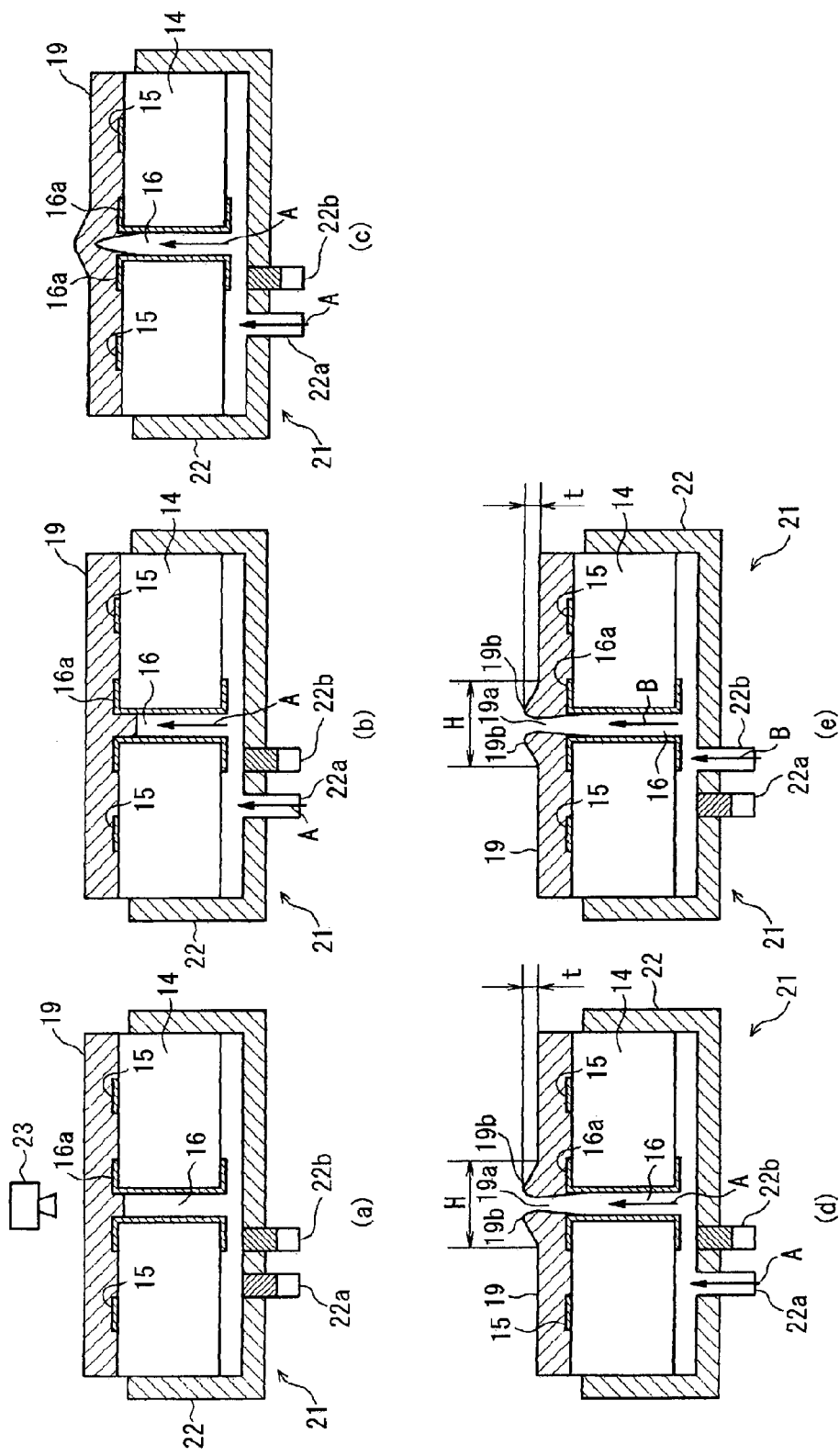
FIGS. 1(a) to (e) are enlarged vertical cross-sectional views of a main portion for sequentially illustrating an applying step according to a first embodiment of the present disclosure.
Figure 3:
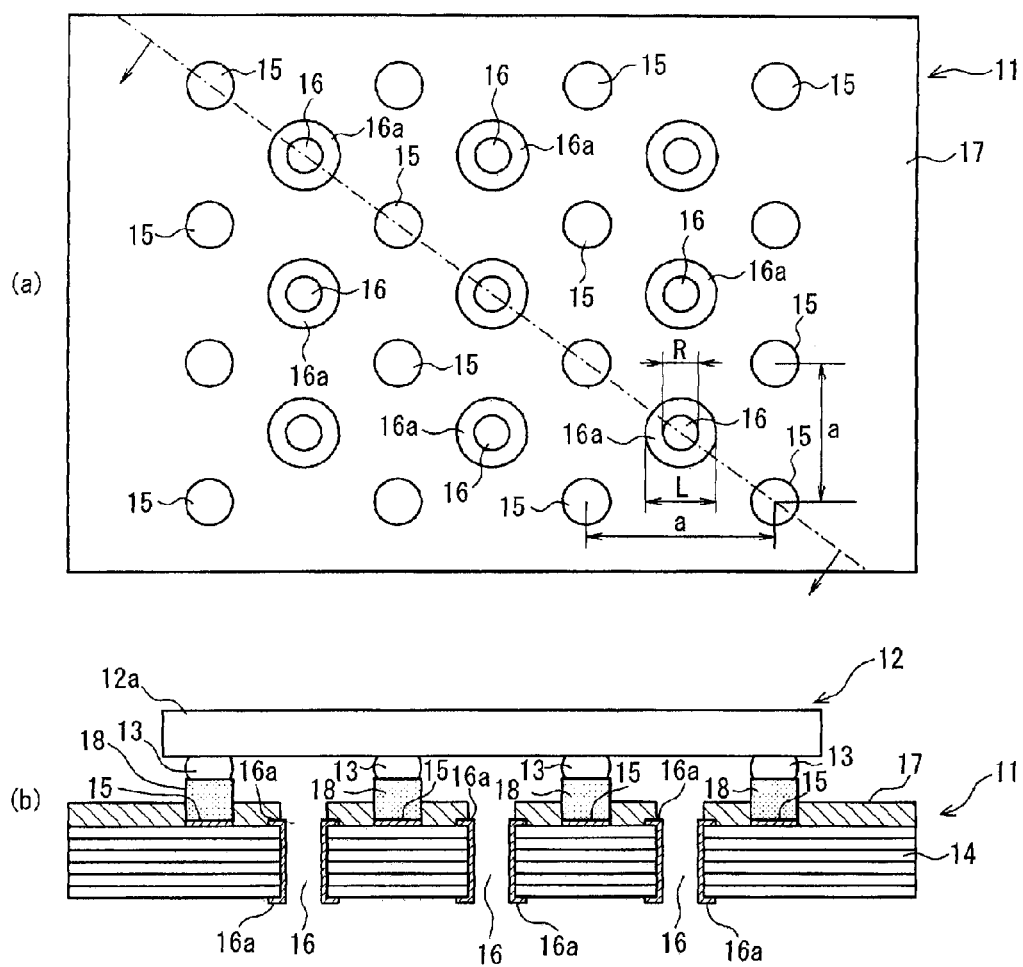
FIG. 3(a) is a schematic enlarged top view of a main portion of a multilayer substrate.
FIG. 3(b) is a vertical cross-sectional view schematically illustrating a state where a BGA-type component is mounted on the multilayer substrate.

A first embodiment will be hereinafter described with reference to FIG. 1(a) to FIG. 4(g). FIG. 3(a) schematically illustrates an appearance constitution of a front surface (upper surface) of a multilayer substrate 11 formed in the present embodiment. FIG. 3(b) schematically illustrates the multilayer substrate 11 on which a BGA (Ball Grid Array)-type component 12 such as, for example, a CPU or the like is mounted. As shown in FIG. 3(b), the BGA-type component 12 is provided with many ball-shaped solder bumps 13 in a grid on a mounting surface (lower surface) of a rectangular package 12a.

In contrast, the multilayer substrate 11 includes a base 14 that has layers made of an insulating material, such as an epoxy resin containing a glass fiber, for example, and conductive patterns, which are formed by plating a copper foil, on a front surface of the base 14 and between the layers of the base 14. As the conductive patterns, many lands 15 to which the BGA-type component 12 is soldered are disposed on the front surface of the multilayer substrate 11 to correspond to the solder bumps 13 of the BGA-type component 12. As shown in FIG. 3(a), these lands 15 are arranged in a vertical direction and in a horizontal direction of the front surface of the multilayer substrate 11, and vertical and horizontal distances a between centers of the lands 15 are 800 μm, for example.

In the multilayer substrate 11, a conductive through hole 16 is formed between the lands 15 (at a center of four lands 15 those are placed on four apexes of a square) to restrict a signal interference between signal lines. The conductive through hole 16 is provided with circular through hole lands 16a at both the upper surface and a lower surface of the multilayer substrate 11 and a copper plating formed on an inner surface of a through hole and connecting the through hole lands 16a on the upper surface and the lower surface of the multilayer substrate 11. The conductive through hole 16 has, for example, a ground potential. An inner diameter R of the conductive through hole 16 is, for example, 300 µm and a diameter L of the through hole land 16a is, for example, 550 µm.

The front surface of the multilayer substrate 11, other than a required portion (the land 15 and an upper surface portion of the conductive through hole 16), is covered with a resist film 17 formed of a solder resist. The resist film 17 has a thickness of, for example, about 30 µm. The details of a structure (fabricating process) of the resist film 17 will be described later. For mounting the BGA-type component 12 on the multilayer substrate 11, a soldering step called as reflow is performed.

In the reflow step, as shown in FIG. 3(b), a soldering paste 18 is applied on the lands 15 of the multilayer substrate 11 and the BGA-type component 12 is mounted on the multilayer substrate 11 and positioned so that each solder bump 13 is placed on each land 15 (soldering paste 18), and thereafter the multilayer substrate 11 is heated through a reflow furnace that is not illustrated. As a result, the solder bump 13 and the soldering paste 18 are melted and integrated with each other, and soldered with the land 15 when cooled and hardened thereafter. As such, the BGA-type component 12 is connected electrically and mechanically with the multilayer substrate 11.

FIGS. 4(a) to (g) illustrate a basic manufacturing process of the multilayer substrate 11 (a main portion after the conductive through hole 16 is formed). That is, as shown in FIG. 4(a), a drilling step is performed to form a through hole 14a for the conductive through hole 16, using for example a drill or a laser, in the base 14 on which the conductor patterns have been formed. At this point, the land 15 and the through hole land 16a have been already formed on both the upper surface and the lower surface of the base 14, and the through hole 14a is formed at a center of the through hole land 16a.

Next, as shown in FIG. 4(b), a copper plating is formed in the conductive through hole 16 (the through hole 14a) so that the conductive through hole 16 is electrically conducted up and down through the base 14 (between the upper through hole land 16a and the lower through hole land 16a). A plating treatment is performed by an electroless copper plating after a pretreatment of the inner surface of the through hole 14a. After the plating treatment, a plating solution is washed and the base 14 is dried.

As shown in FIGS. 4(c) to (f), a step of forming the resist film 17 on the front surface of the base 14 is performed. As shown in FIG. 4(c), an applying step of applying a liquid (gel) photosensitive resist 19 to the entirety of the front surface portion of the base 14 is performed. To distinguish from the resist film 17 after hardened, the resist before hardened is designated with a symbol 19. A detail of the applying step in the present embodiment will be described later. In the applying step, an air hole (an illustration is omitted in FIG. 4(c)) is formed in a layer of the resist 19.

After the resist 19 applied to the front surface of the base 14 is heated and dried, as shown in FIG. 4(d), a photo mask 20 is placed on an upper surface of the resist 19. The photo mask 20 has light-shielding portions 20a that shield portions where the resist film 17 is not formed, that is, the land 15 and the through hole land 16a. The portion other than the light-shielding portions 20a can transmit light. In the drawings, only the light-shielding portions 20a are hatched. As shown in FIG. 4(e), an exposing step of exposing and hardening the resist 19 is performed by applying light (ultraviolet light) from a top of the photo mask 20 placed adjacent to the upper surface of the base 14.

After the exposing step, the portion of the resist 19 covered with the light-shielding portions 20a on the land 15 and the through hole land 16a remains in an unhardened state and a remaining portion of the resist 19 is hardened. In a next washing step, as shown in FIG. 4(f), an unhardened portion of the resist 19 is washed and removed by a washing liquid (solvent). As a result, the resist film 17 covering the required portion is formed. In this way, the multilayer substrate 11 is formed. Thereafter, a mounting step (the reflow step described above) of mounting the BGA-type component 12 on the multilayer substrate 11 is performed.

In the present embodiment, as shown in FIGS. 1(a) to (e), the applying step is performed while restricting the resist 19 from entering the conductive through hole 16 (forming an air hole 19a communicating with the conductive through hole 16 in the resist 19) by supplying a high pressure air to a rear surface (lower surface) of the base 14 to pass through the conductive through hole 16 in an upward direction using an air supply mechanism 21.

The air supply mechanism 21 has a jig 22 to create an airtight state where an air supply space is secured at the lower surface of the base 14. A bottom wall of the jig 22 has a first high pressure air supply port 22a for room temperature and a second high pressure air supply port 22b for high temperature, which are adjacent to each other in a left and right direction in the drawing. Although not illustrated, the air supply mechanism 21 includes: a compressor generating a high pressure air; a switching device supplying the air from the compressor selectively to the first high pressure supply port 22a and the second high pressure supply port 22b; a pressure adjustment mechanism adjusting the pressure of the air supplied as a pressure adjusting device; and a heater heating the air supplied to the second high pressure air supply port 22b.

Therefore, it is established a temperature controlling device that can adjust the air supplied from the air supply mechanism 21 to at least two temperature levels, one being the normal temperature (room temperature) air to be supplied through the first high pressure supply port 22a and the other being the high temperature air to be supplied through the second high pressure supply port 22b and capable of drying the resist 19. In this case, the applying step is performed in such a manner that the normal temperature air is supplied first, and then the high temperature air is supplied in a state where the air hole 19a communicating with the conductive through hole 16 is formed in the resist 19 applied to the front surface of the base 14.

In the applying step, a camera 23 monitoring a state of the front surface of the base 14 (resist 19) is provided. Based on an analysis of an image photographed by the camera 23, the pressure of the air to be supplied is adjusted by the pressure adjustment mechanism to form the air hole 19a with a prescribed size in the resist 19, as shown in FIGS. 1(d) and (e). Furthermore, in the present embodiment, the pressure of the air to be supplied is adjusted so that a swelling portion 19b of the resist 19 swelling on a periphery of the air hole 19a has an expansion dimension (diameter) H slightly larger than a diameter D of the light-shielding portion 20a of the photo mask 20 (see FIG. 2(a); for example, 400 µm) and has a height t of several µm to 10 µm, which does not affect following disposal of the photo mask 20.

The applying step using the air supply mechanism is performed as shown in FIGS. 1(a) to (e). That is, as shown in FIG. 1(a), the jig 22 is positioned to the rear surface of the base 14 in which the conductive through hole 16 has been formed. Then, the resist 19 is applied to the entirety of the front surface of the base 14. Next, as shown in FIG. 1(b), the normal temperature and high pressure air is supplied from the first high pressure supply port 22a as shown by an arrow A. At this point, the second high pressure air supply port 22b is closed. Therefore, the high pressure air is supplied into the conductive through hole 16 from a lower portion of the conductive through hole 16 and the resist 19 on the conductive through hole 16 is swelled upward, as shown in FIG. 1(c).

Finally, as shown in FIG. 1(d), the air hole 19a communicating with the conductive through hole 16 is formed in the resist 19 and the swelling portion 19b swelling upward around the air hole 19a is also formed. At this point, the diameter of the air hole 19a, the expansion dimension H and the height t of the swelling portion 19b are controlled. After the air hole 19a having the prescribed diameter is formed, as shown in FIG. 1(e), the first high pressure air supply port 22a is closed and the high temperature and high pressure air is supplied from the second high pressure air supply port 22b as shown by an arrow B. As a result, the high temperature air passes through the air hole 19a of the resist 19, and dries the surface of the resist 19. Thus, the shape of the resist 19 (the air hole 19a and the swelling portion 19b) is retained.

After the applying step is performed as described above, the steps as shown in FIGS. 2(a) to (c) are performed. That is, as shown in FIG. 2(a), the exposing step in which the photo mask 20 is disposed on the upper surface of the resist 19 and thereafter the resist 19 is exposed and hardened is performed. At this point, since a communication state between the air hole 19a and the conductive through hole 16 is secured and the resist 19 does not enter the conductive through hole 16, the resist 19 is not hardened in the conductive through hole 16.

Next, as shown in FIG. 2(b), the washing step of removing the unhardened portion of the resist 19 is performed. Thus, the multilayer substrate 11 is formed. In this case, as clearly shown in the drawing, an opening portion of the conductive through hole 16 is exposed sufficiently, and is not closed by the resist film 17 (resist 19). Therefore, it is less likely that the washing liquid will remain in the conductive through hole 16. Since the expanded dimension H of the swelling portion 19b is greater than the diameter D of the light-shielding portion 20a of the photo mask 20, the swelling portion 19b formed in the resist 19 partly remains. Therefore, a projection portion 17a that slightly projects upward is formed in the resist film 17.

Thereafter, as shown in FIG. 2(c), the mounting step (the reflow step) of mounting the BGA-type component 12 on the multilayer substrate 11 is performed. In this case, the projection portion 17a acts as a dam to block a flow of a solder and restricts a formation of a solder bridge. A height h from the upper surface of the multilayer substrate 11 to the lower surface of the package 12a of the BGA-type component 12 is, for example, approximately 50 µm. Therefore, the projection portion 17a does not obstruct the mounting of the component.

According to the manufacturing process of the present embodiment, in the step of forming the resist film 17 at the front surface portion of the multilayer substrate 11, the applying step of applying the photosensitive resist 19 to the entirety of the front surface portion of the base 14 is performed to restrict the resist 19 from entering the conductive through hole 16 by supplying the high pressure air from the rear surface of the base 14 to pass through the conductive through hole 16 using the air supply mechanism 21. Therefore, irrespective of a displacement of the photo mask 20, the applying step can be finished in a state where the resist 19 does not remain (enter) in the conductive through hole 16, and the following exposing step and washing step can be performed. As a result, it is less likely that the washing liquid will remain in the conductive through hole 16.

As a result, according to the present embodiment, an occurrence of a fault caused by the washing liquid remaining in the conductive through hole can be reduced, in the manufacturing process of the multilayer substrate for having the BGA-type component thereon in which the conductive through hole for restricting the signal interference is formed and the resist film is formed. Especially in the present embodiment, since the projection portion 17a slightly projecting upward is formed in the resist film 17, the advantage that an occurrence of the solder bridge is further restricted can be achieved.

Second Embodiment

A second embodiment will be described hereinafter with reference to FIG. 5 to FIG. 8. Also in the present embodiment, the basic structure of the multilayer substrate 11, the construction of the BGA-type component 12 and the basic steps (FIGS. 4(a) to (g)) of the method for manufacturing the multilayer substrate 11 are similar to those of the first embodiment. Therefore, the same portions as those of the first embodiment will be designated with the same symbols, and a new illustration and a detailed description thereof are omitted. Hereinafter, different points will be described.

Figure 4:
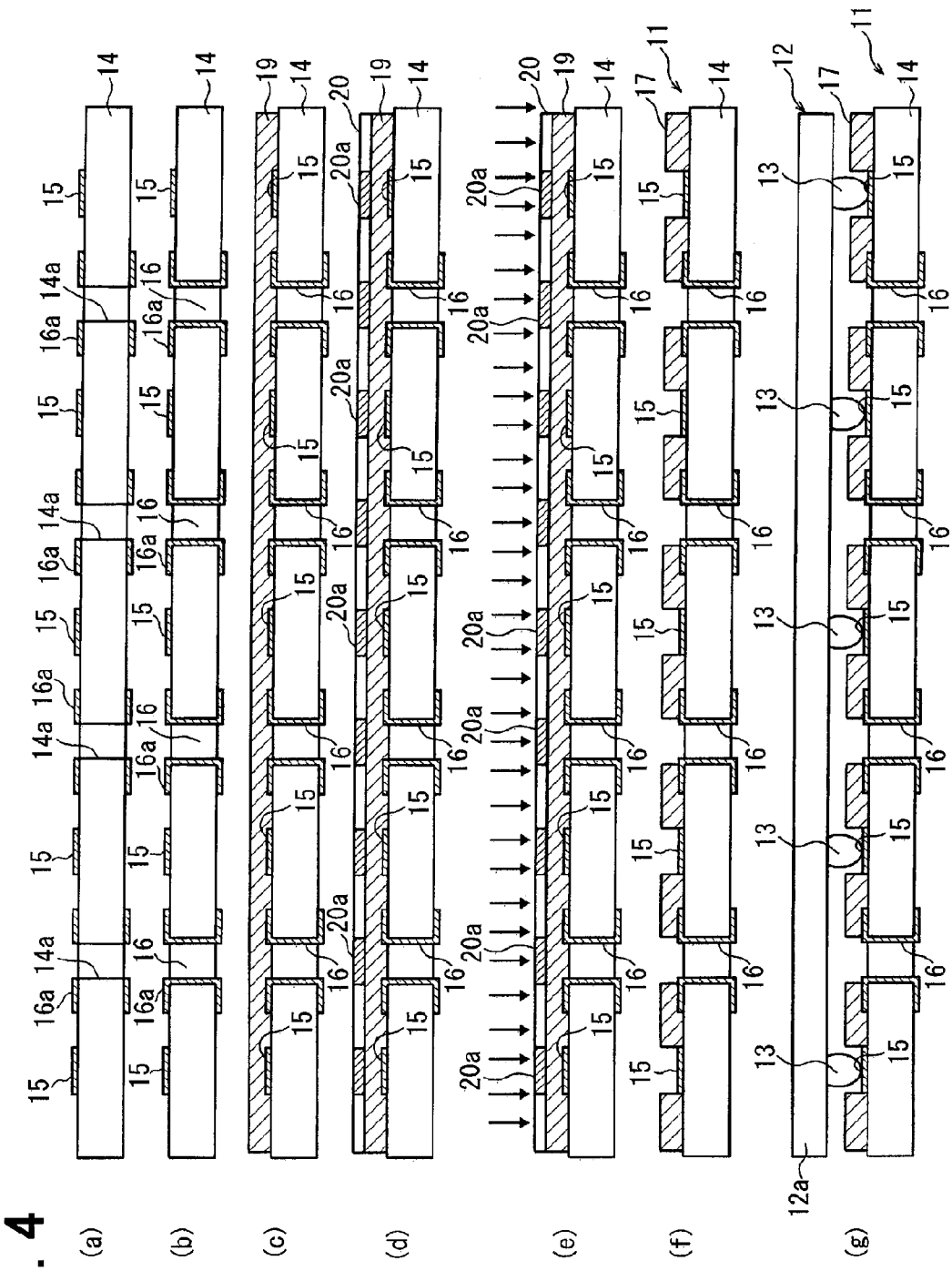
FIGS. 4(a) to (g) are vertical cross-sectional views for explaining a basic manufacturing process of the multilayer substrate.

A different point of the second embodiment from the first embodiment is that a structure of a photo mask 31 used in the exposing step is devised, in place of the supplying of the high pressure air in the applying step, in the step of forming the resist film. Therefore, in the present embodiment, in the applying step, as shown in FIG. 4 (c), the exposing step is performed after the resist 19 is applied to the entirety of the front surface of the base 14, heated and dried.

Figure 5:
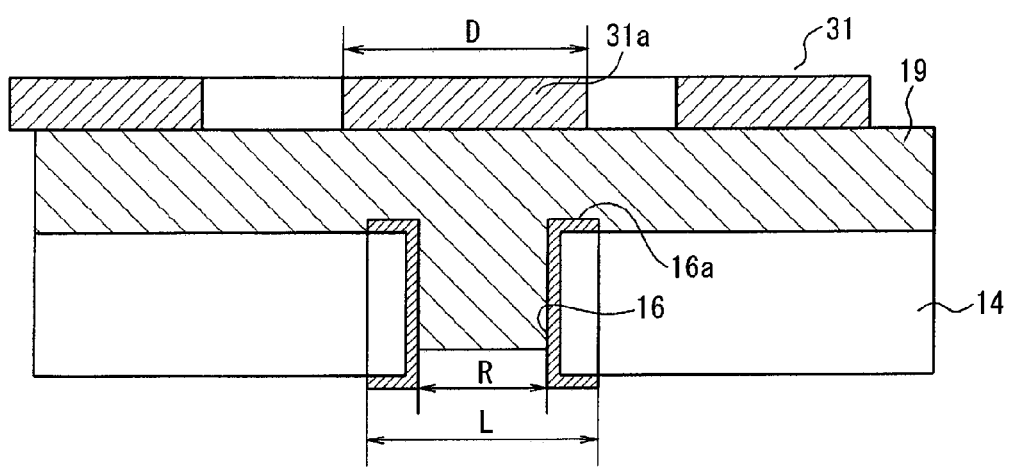
FIG. 5 is an enlarged vertical cross-sectional view of a main portion schematically illustrating a state where a photo mask is disposed adjacent to a base according to a second embodiment of the present disclosure.
Figure 6:
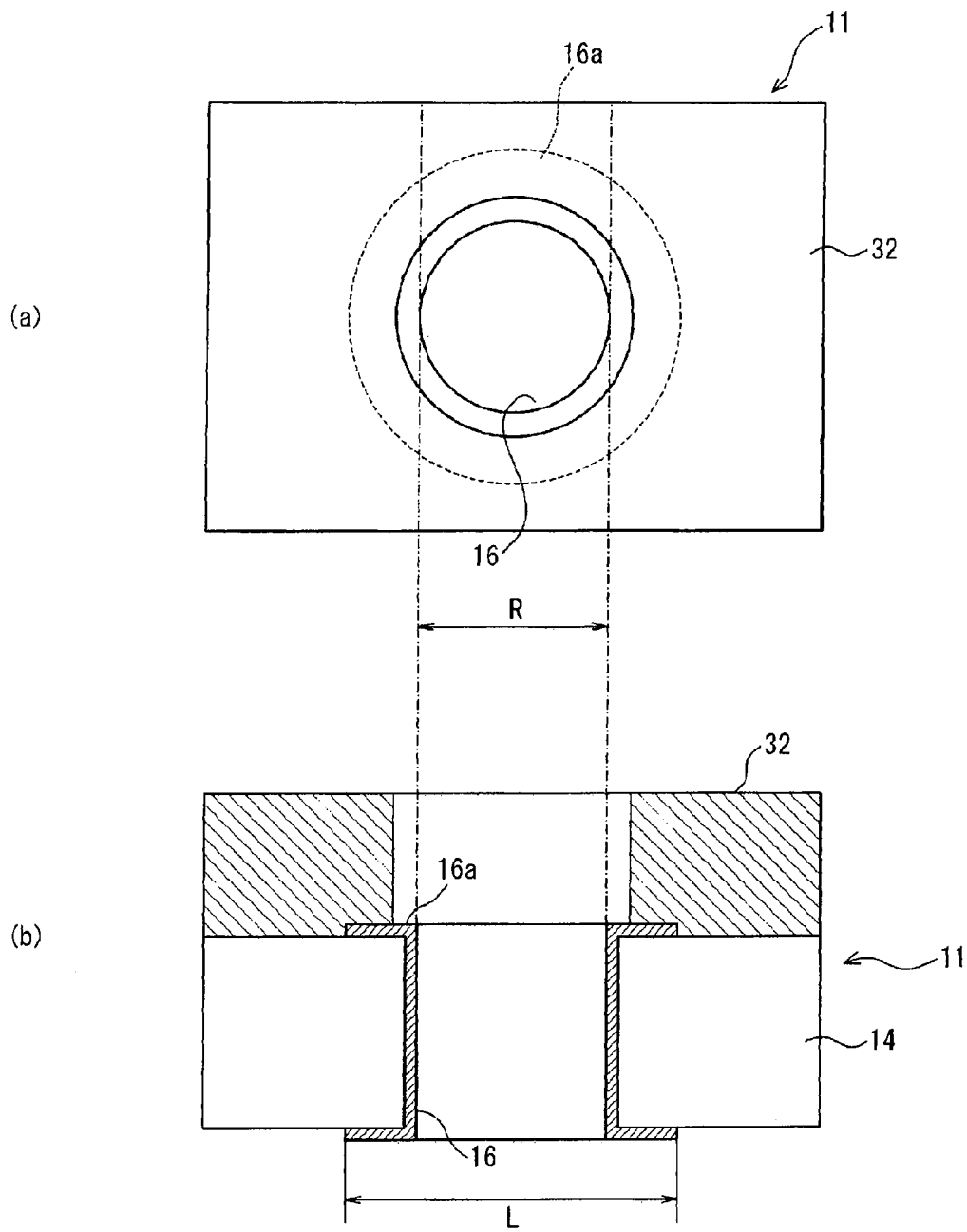
FIG. 6(a) is a plan view of a portion corresponding to a conductive through hole illustrating a resist film formed in a state where the photo mask is properly positioned on the base.
FIG. 6(b) is a vertical cross-sectional view of the portion illustrated in FIG. 6(a)
Figure 7:
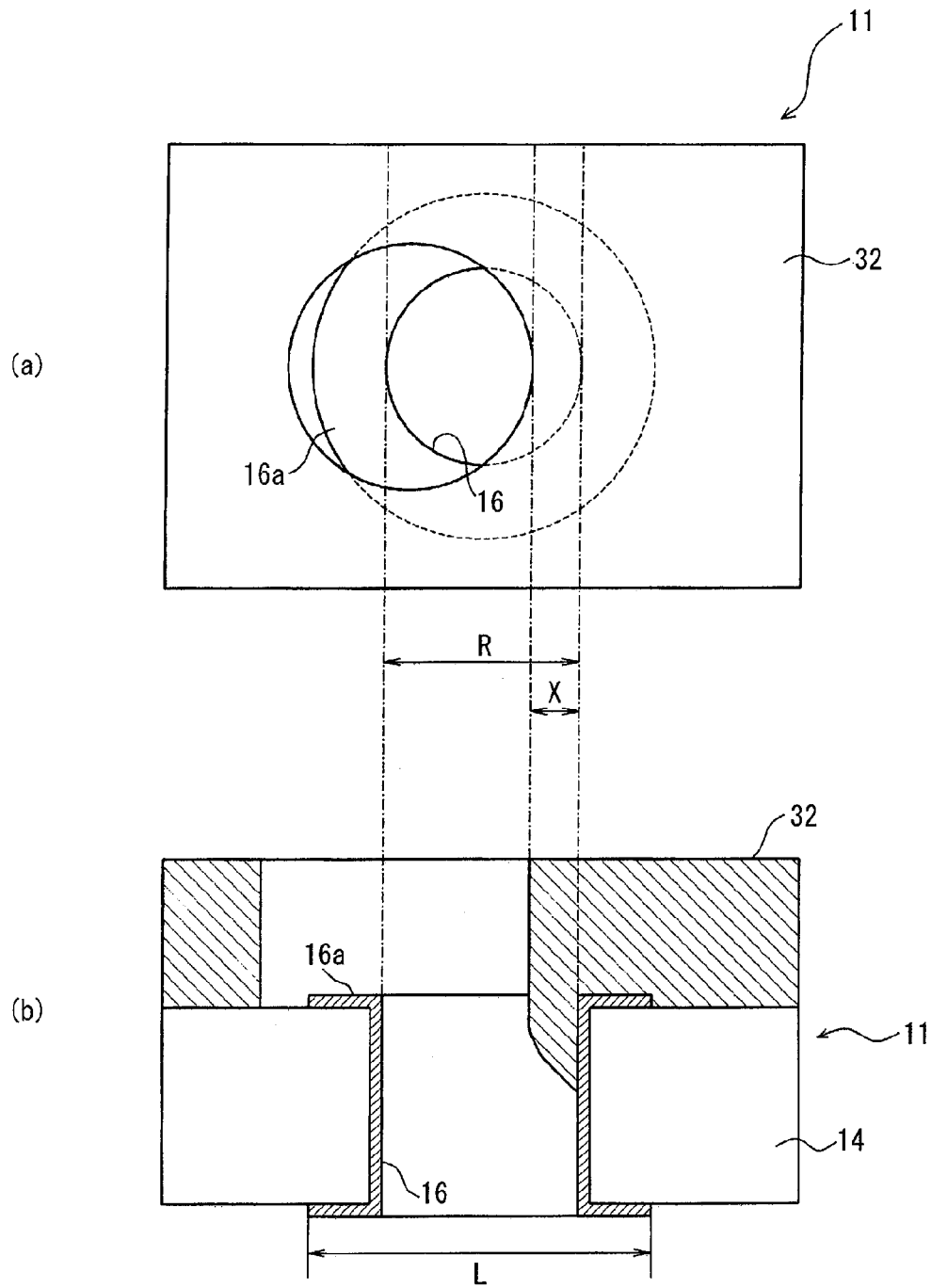
FIG. 7(a) is a plan view of the portion corresponding to the conductive through hole illustrating the resist film formed in a state where the photo mask is displaced at the maximum relative to the base.
FIG. 7(b) is a vertical cross-sectional view of the portion illustrated in FIG. 7(a)

The photo mask 31 used in the present embodiment also has a light-shielding portion that covers a portion where a resist film 32 is not formed (see FIGS. 6(a), (b) and FIGS. 7(a), (b)). As shown in FIG. 5, a portion of the photo mask 31 that covers the upper surface of the conductive through hole 16 is provided as a circular light-shielding portion 31a. The circular light-shielding portion 31a has a diameter D that allows a dimension X of an uncovered portion of the conductive through hole 16 in a direction along a diameter of the conductive through hole 16 (an over-resist length X in FIGS. 7(a) and (b)) to be equal to or less than 10% of the inner diameter R of the conductive through hole 16, even if the photo mask 31 is displaced from the base 14 by a maximum allowable range.

Specifically, the diameter D of the circular light-shielding portion 31a of the photo mask 31 is equal to or less than the diameter (outer diameter) L of the through hole land 16a, and is equal to or greater than the sum of the inner diameter R of the conductive through hole 16 and a maximum allowable displacement amount Y. Considering the amount of a light diffusion in the layer of the applied resist 19 in the exposing step, the diameter D is equal to or greater than the sum of the inner diameter R of the conductive through hole 16, the maximum allowable displacement amount Y and the maximum amount of the light diffusion α.

In the present embodiment, the inner diameter R of the conductive through hole 16 is, for example, 300 µm and the diameter (outer diameter) L of the through hole land 16a is, for example, 550 µm. Also, the maximum allowable displacement amount Y is, for example, ±100 µm (in this case, calculated as 200 µm). The maximum amount of the light diffusion α is, for example, 5 to 10 µm. In the present embodiment, the maximum amount of the light diffusion α is calculated as 10 µm. Accordingly, the diameter D of the circular light-shielding portion 31a is in the range of 510 (500) µm≤D≤550 µm. For example, the diameter D of the circular light-shielding portion 31a is 510 µm.

FIGS. 6(a) and (b) illustrate the resist film 32 that is formed in the exposing step in an ideal state where the photo mask 31 has no displacement relative to the base 14, and a center of the conductive through hole 16 and a center of the circular light-shielding portion 31a are consistent. In this case, a circular opening portion in which the resist film 32 does not exist is formed on the conductive through hole 16, and the resist film 32 covers a part of a peripheral portion of the through hole land 16a.

In contrast, FIGS. 7(a) and (b) illustrate the resist film 32 that is formed in a state where the photo mask 31 is displaced relative to the base 14 in a leftward direction of the drawing by the maximum allowable range, that is, the photo mask 31 is placed such that the center of the circular light-shielding portion 31a is displaced from the center of the conductive through hole 16 by 100 µm in the leftward direction. In this case, there is a possibility that an over resist portion 32a is formed, that is, the resist film 32 is positioned to cover the conductive through hole 16 due to the portion of the resist 19 that covers a right portion of the conductive through hole 16 being exposed and hardened in the exposing step.

In the present embodiment, since the photo mask 31 having the circular light-shielding portion 31a as described above is used in the exposing step. Therefore, even when the maximum allowable displacement has occurred, the maximum width (over resist length) X of the over resist portion 32a that remains (enters) in the conductive through hole 16 in the direction of the diameter of the conductive through hole 16 can be kept equal to or less than 10% of the inner diameter R of the conductive through hole 16, that is, equal to or less than 30 µm. Because the over resist length X can be kept equal to or less than 10% of the inner diameter R of the conductive through hole 16, a residual of the washing liquid, and further an occurrence of a disconnection of the conductive through hole 16 can be restricted.

Figure 8:
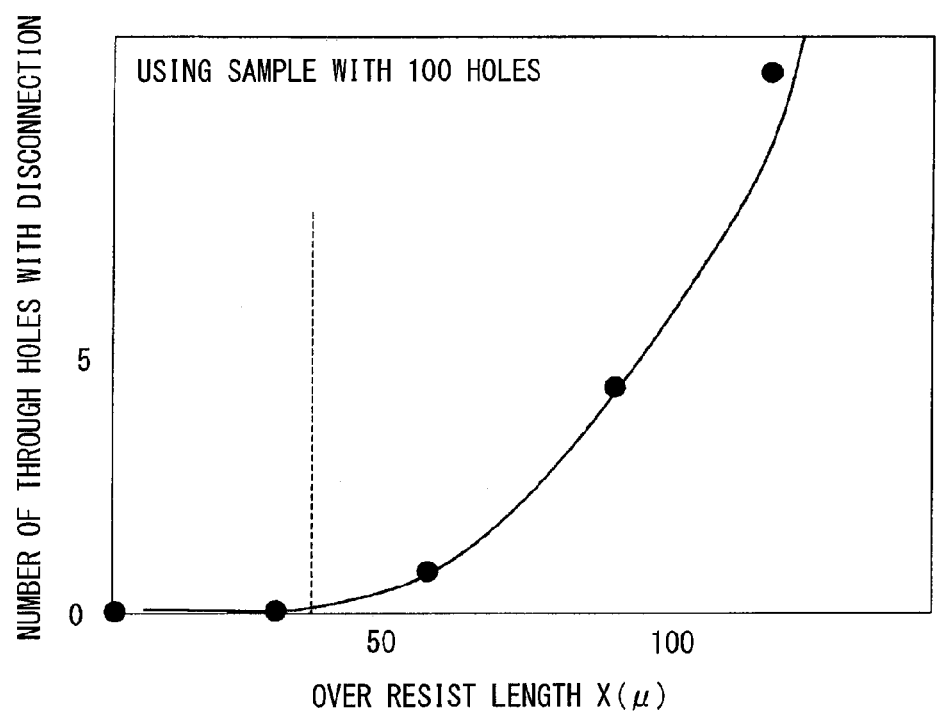
FIG. 8 is a graph illustrating an experimental result of a relationship between an over resist length X and the number of the conductive through holes with disconnections.

Inventors of the present disclosure performed an experiment to examine a relationship of the over resist length X against the diameter (inner diameter) R of the conductive through hole 16 and the occurrence of the disconnection of the conductive through hole 16 that is caused by the residual of the washing liquid in the conductive through hole 16. In this experiment, several types of samples are prepared to have different over resist length X by forming the resist film while displacing the photo mask relative to the base that has one hundred conductive through holes with the inner diameter of 300 µm in the multilayer substrate. The relationship of the over resist length X and the number of the conductive through holes with the disconnections is examined. The result thereof is shown in FIG. 8.

As a result, when the over resist length X is equal to or less than 30 µm, the disconnection of the conductive through hole does not occur. When the over resist length X is greater than 30 µm, the disconnection of the conductive through hole occurs, and the number of the disconnection increases as the over resist length X increases. In other words, it is appreciated that, if the over resist length X is kept equal to or less than 10% of the inner diameter R of the conductive through hole, the disconnection of the conductive through hole, that is, the residual of the washing liquid in the conductive through hole does not occur.

In the present embodiment, the circular light-shielding portion 31a of the photo mask 31 is formed to have the diameter D so that the dimension X (over resist length X) of the portion of the conductive through hole 16 that is not covered with the photo mask 31 in the direction of the diameter is equal to or less than 10% of the inner diameter R of the conductive through hole 16, even when the photo mask 31 has the maximum allowable displacement Y on the base 14. Therefore, the disconnection of the conductive through hole 16 will not occur. Also, the diameter D of the circular light-shielding portion 31a is equal to or less than the external diameter L of the through hole land 16a. Therefore, the opening portion of the resist film 32 on the conductive through hole 16 is less likely to be uselessly enlarged and the generation of the solder bridge can be restricted.

According to the present embodiment, in the multilayer substrate 11 on which the BGA-type component 12 is mounted and in which the conductive through hole 16 for restricting the signal interference is formed and the resist film 32 is formed, the occurrence of the fault caused by the residual of the resist 19 in the conductive through hole 16 can be restricted.

Third Embodiment, Other Embodiments

A third embodiment will be hereinafter described with reference to FIG. 9 to FIG. 11(b). Also in the present embodiment, the basic structure of the multilayer substrate 11, the construction of the BGA-type component 12 and the basic steps of the method for manufacturing the multilayer substrate 11 (FIGS. 4(a) to (g)) are similar to those of the first embodiment and the second embodiment. Therefore, the same portions as those of the first embodiment and the second embodiment will be designated with the same symbols, and the new illustration and a detailed description thereof will be omitted. Hereinafter, different points will be described.

A different point of the third embodiment from the second embodiment is that, as shown in FIGS. 10(a) and (b), a diameter S of an opening portion of a resist film 42, which is formed at a front surface portion of a conductive through hole 41 on the mounting surface (upper surface) of the base 14 on which the BGA-type component 12 is mounted, is equal to (or less than) an inner diameter R0 of the through hole 14a for forming the conductive through hole 41. Specifically, in the present embodiment, the inner diameter R0 (a drill diameter) of the through hole 14a is, for example, 300 µm.

Also, in the present embodiment, as shown in FIGS. 11(a) and (b), in a rear surface resist film forming step of forming a rear surface resist film 43, which covers a portion other than each conductive through hole 41, on a non-mounting surface, that is, the lower surface of the base 14 on which the BGA-type component 12 is not mounted, a diameter S' of an opening portion of the rear surface resist film 43 is greater than the inner diameter R0 of the through hole 14a by 150 µm or more. Specifically, in the present embodiment, the diameter S' of the opening portion is 450 µm.

Figure 9:
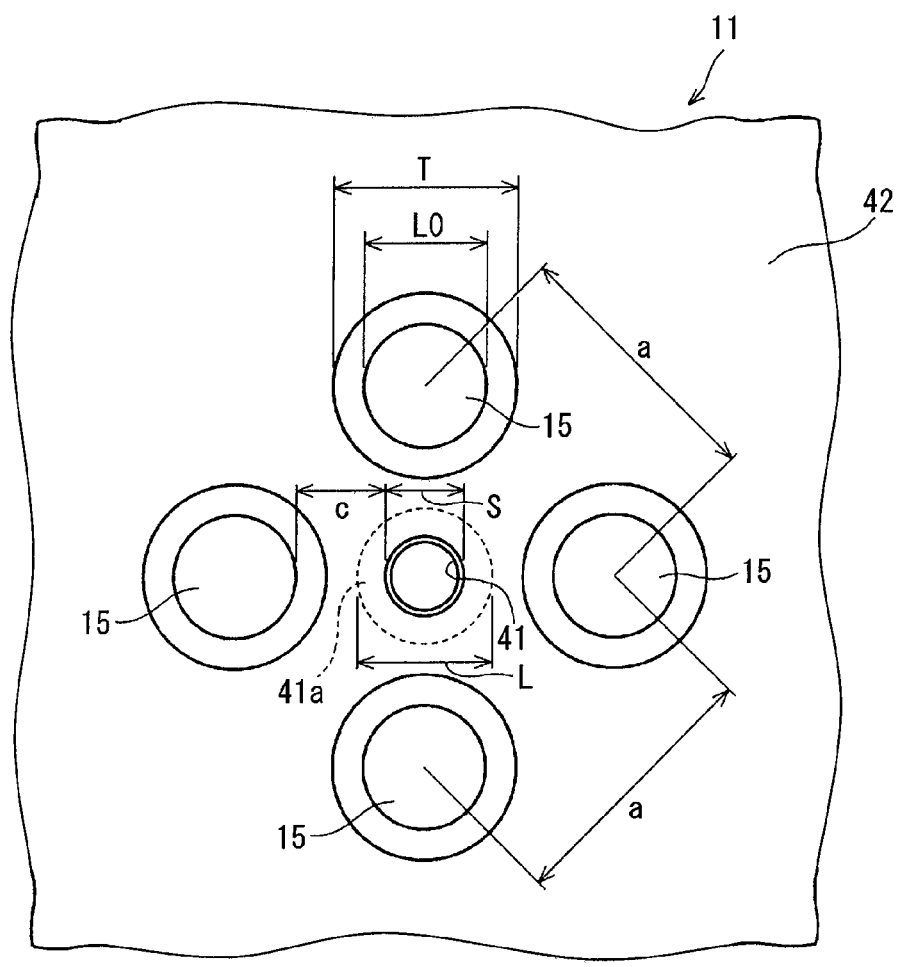
FIG. 9 is an enlarged top view of a main portion of a multilayer substrate according to a third embodiment of the present disclosure.

As shown in FIG. 9, in the present embodiment, similar to the first embodiment and the second embodiment, many lands 15 where the BGA-type component 12 is soldered are arranged on the front surface of the multilayer substrate 11 (base 14) at an equal pitch a (for example, 800 µm) in the vertical direction and in the horizontal direction. A diameter LO of the lands 15 is, for example, 400 µm and a diameter T of a circular opening portion of the rear surface resist film 43 on the land 15 is, for example, 500 to 600 μm.

As also shown in FIGS. 10(a), (b), and FIGS. 11(a), (b), the conductive through hole 41 for restricting the signal interference between the signal lines is formed between the lands 15 (at the center of four lands 15 placed on four apexes of the square) in the multilayer substrate 11. After the through hole 14a is formed in the base 14 by the drill or the like, the conductive through hole 41 is provided with circular through hole lands 41a at both the upper surface and the lower surface of the base 14 and an inner surface of the through hole 14a on which the plating (copper plating) with the predetermined thickness (for example, 25 μm) is formed. Therefore, an inner diameter R of the conductive through hole 41 is 250 μm and a diameter L of the through hole land 41a is, for example, 500 μm.

In the present embodiment, after a plating step of the conductive through hole 41, a step of forming the resist film 42 on the front surface of the base 14 and the step of forming the rear surface resist film 43 on the non-mounting surface (rear surface) of the base 14 are performed. These steps of forming the resist film 42 and the rear surface resist film 43 also include the applying step, the exposing step and the washing step.

In the forming of the resist film 42 on the front surface of the base 14, the resist 19 is applied to the entirety of the surface of the base 14 in the applying step. In the next exposing step, as shown in FIG. 10(a), a photo mask 44 having a light-shielding portion that covers a portion where the resist film 42 is not formed is used. A portion of the photo mask 44 that covers the upper surface of the conductive through hole 41 is provided as a circular light-shielding portion 44a.

The circular light-shielding portion 44a (circular light-shielding portion 31a) is formed with a diameter D so that the diameter S of the opening portion of the resist film 42 formed at the front surface portion of the through hole 41 is equal to (or less than) the inner diameter R0 of the through hole 14a. More specifically, the diameter D of the circular light-shielding portion 44a of the photo mask 44 is equal to the sum (R0+α) of the inner diameter R0 of the through hole 14a and the amount of the light diffusion α. For example, when the inner diameter R0 is 300 μm and the amount of the light diffusion α is 5 to 10 μm, the diameter D is 305 to 310 μm.

FIG. 10(b) and FIG. 9 illustrate the resist film 42 that is formed in the exposing step in an ideal state where the photo mask 44 has no displacement on the base 14 and a center of the conductive through hole 41 and a center of the circular light-shielding portion 44a are consistent. In this case, on the conductive through hole 41, a circular opening portion where the resist film 42 does not exist is formed with the diameter equal to the inner diameter R0 of the through hole 14a, and the resist film 42 covers the base 14 except for an inner peripheral portion of the through hole land 41a (a thickness of the plating layer (for example, 25 μm)). As shown in FIG. 9, the resist film 42 is formed so that a shortest distance c between the land 15 and the through hole land 41a, which are conductive portions exposed at the front surface portion of the base 14, is equal to or greater than 200 μm. In the present embodiment, the shortest distance c is, for example 216 μm.

Figure 11:
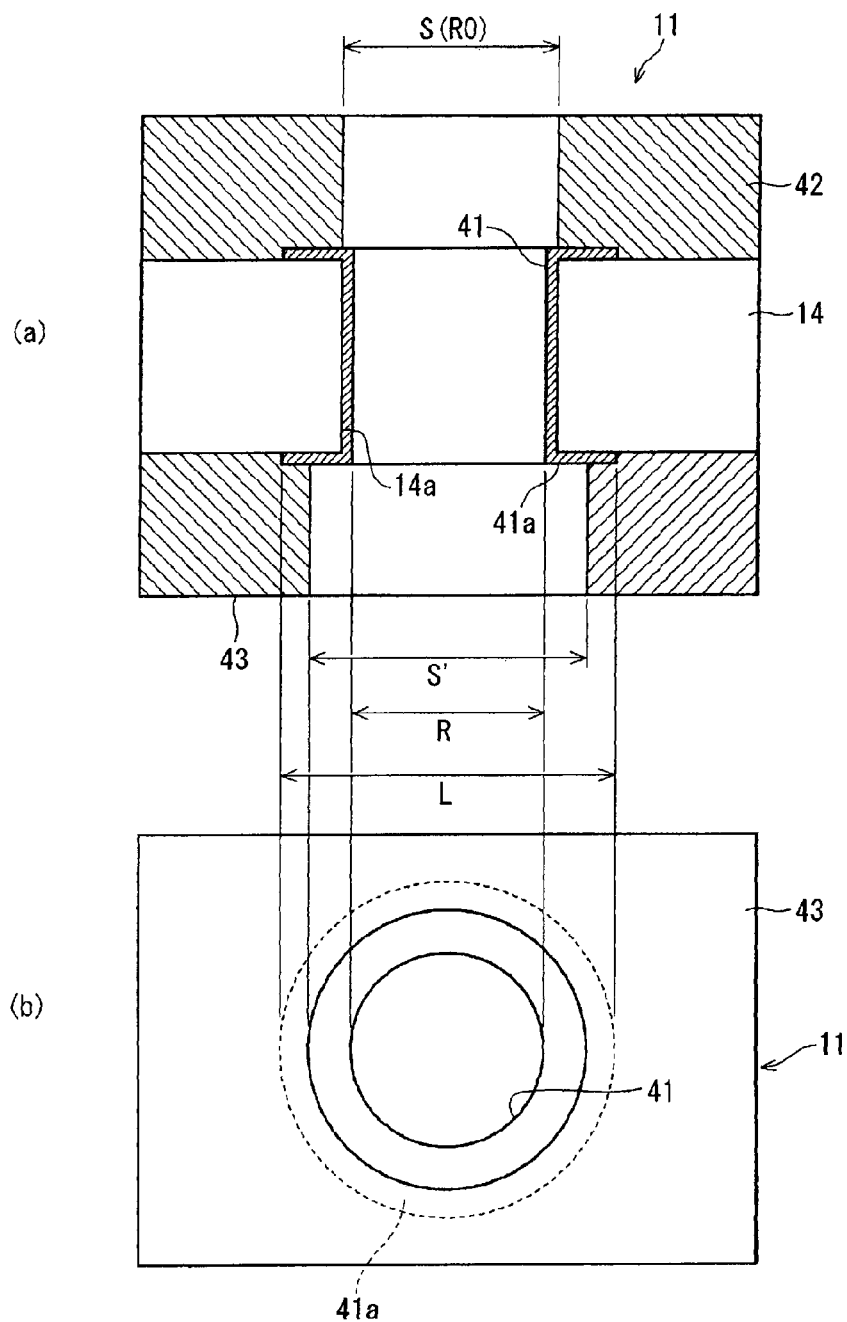
FIG. 11(a) is an enlarged vertical cross-sectional view of a main portion illustrating a rear surface resist film formed on a non-mounting surface of the base.
FIG. 11(b) is an enlarged bottom view of the portion illustrated in FIG. 11(a)
Figure 12:
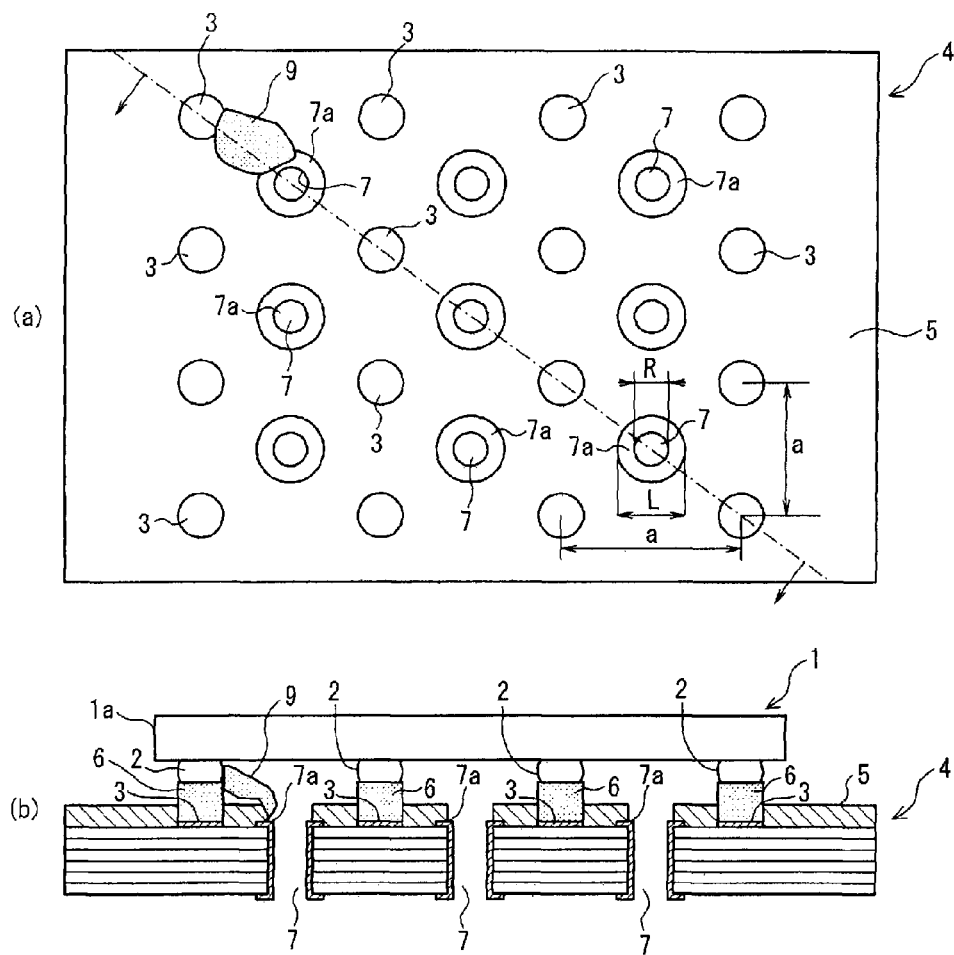
FIG. 12(a) is a schematic enlarged top view of a main portion of a multilayer substrate as a related art.
FIG. 12(b) is an enlarged vertical cross-sectional view schematically illustrating a state where a BGA-type component is mounted on the multilayer substrate illustrated in FIG. 12(a).
Figure 14:
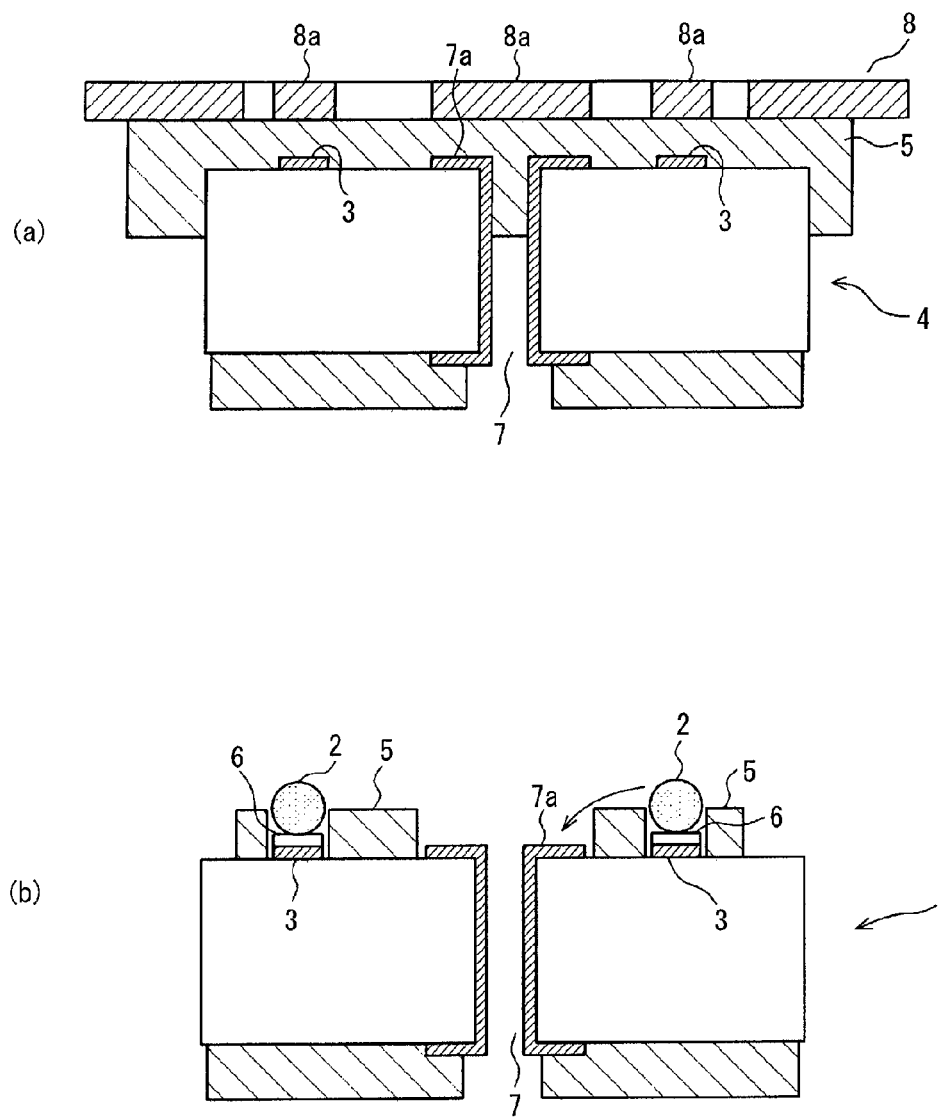
FIGS. 14(a) and (b) are vertical cross-sectional views schematically illustrating a resist film formed when a circular light-shielding portion of the photo mask is enlarged, as a related art.

In the step of forming the rear surface resist film 43, the applying step of applying the resist 19 to the entirety of the rear surface of the base 14 is also performed and the exposing step is performed next. In the exposing step, although not illustrated, a rear surface photo mask having a circular light-shielding portion to cover the lower surface of the conductive through hole 41 is used. As shown in FIG. 11, the circular light-shielding portion of the rear surface photo mask is formed to have a diameter D' so that the diameter S' of the opening portion of the rear surface resist film 43 is greater than the inner diameter R0 (300 μm) of the through hole 14a by 150 μm or more. More specifically, when the opening diameter S' is, for example, 450 μm, the diameter D' of the circular shielding portion of the rear surface photo mask is equal to the sum of 450 μm and the amount of the light diffusion α (5 to 10 μm), that is, for example 455 to 460 μm.

According to the third embodiment, following function and effect can be achieved. In the step of forming the resist film 42 on the mounting surface (front surface) of the base 14 on which the BGA-type component 12 is mounted, the circular light-shielding portion 44a of the photo mask 44 used in the exposing step that covers the front surface portion of the conductive through hole 41 has the diameter D so that the diameter S of the opening portion of the resist film 42 that is formed at the front surface portion of the conductive through hole 41 is equal to or less than the inner diameter R0 of the through hole 14a.

As a result, the opening portion of the resist film 42 at the front surface portion of the conductive through hole 41 will be small enough, and the most of the through hole land 41a of the conductive through hole 41 at the front surface portion of the base 14 is covered with the resist film 42. Therefore, a portion of the resist film 42 that extends between the land 15 to which the BGA-type component is soldered and the through hole land 41 can be secured larger (longer). As a result, the solder bridge caused by the solder on the land 15 extending to and connecting to the through hole land 41a can effectively be restricted.

According to studies of the inventors, when the shortest distance c between the land 15 and the through hole land 41a, which are the conductive portions exposed on the front surface of the base 14, is equal to or greater than 200 μm, the occurrence of the solder bridge can be surely restricted. When the diameter S of the opening portion of the resist film 42 is excessively reduced, the problem of the over resist that the resist remains in the conductive through hole 41, as described in the second embodiment, will occur. Therefore, the diameter S of the opening portion of the resist film 42 is preferably nearly equal to the inner diameter R0 of the through hole 14a.

Furthermore, in the present embodiment, the diameter S' of the opening portion of the conductive through hole 41 of the rear surface resist film 43 is greater than the inner diameter R0 of the through hole 14a by 150 μm or more. As such, even when the circular opening portion of the rear surface resist film 43 is large enough and the rear surface photo mask is displaced in the exposing step, the problem that the resist closes the conductive through hole 41 will not arise. Therefore, the problem that the conductive through hole 41 is closed due to the displacement of the photo mask will occur only in one side (front surface) of the base 14. Accordingly, so as a whole, the risk of the displacement of the photo mask (resist layer) can be kept relatively small.

In the above embodiments, an example where the inner diameter R of the conductive through hole 16 is 300 μm (or 250 μm) is chosen, but the dimension of each portion, such as the inner diameter R, is just an example. For example, the conductive through hole 16 with the inner diameter R of approximately 100 μm is currently provided. It is expected to form a conductive through hole with a further small diameter in the feature. Also, the present disclosure is not limited to the embodiments described above, but may be implemented in various other ways without departing from the gist. For example, the base 14 may be made of any other material. While only the selected exemplary embodiments have been chosen to illustrate the present disclosure, the present disclosure is not limited to the said embodiments and structures. Various changes and modification can be made in the present disclosure. Furthermore, various combination and formation, and other combination and formation including one, more than one or less than one element can be made in the present disclosure.

What is claimed is:

1. A method for manufacturing a multilayer substrate for having a BGA-type component thereon, the method comprising:
    forming a plurality of lands to which the BGA-type component is to be soldered in an aligned state at a front surface portion of a base that has an insulation property;
    forming a plurality of conductive through holes for restricting a signal interference to pass through the base from a front surface to a rear surface between the lands; and
    forming a resist film to cover a portion of the front surface portion of the base other than the lands and the conductive through holes, wherein
    the forming of the resist film includes:
    applying a photosensitive resist to an entirety of the front surface portion of the base;
    exposing and hardening the resist in a state where a photo mask that shields a portion where the resist film is not formed is disposed adjacent to the front surface of the base; and
    washing to remove an unhardened portion of the resist, wherein
    the photo mask has a circular light-shielding portion covering a front surface portion of each of the conductive through holes, and
    the circular light-shielding portion has a diameter D that allows a dimension X of an uncovered portion of the conductive through hole in a direction along a diameter of the conductive through hole to be equal to or less than 10% of an inner diameter R of the conductive through hole, even when the photo mask is displaced from the base by a maximum allowable range.

2. The method for manufacturing the multilayer substrate for having the BGA-type component thereon according to claim 1, wherein
    the diameter D of the circular light-shielding portion of the photo mask is equal to or less than a diameter L of a through hole land, and equal to or greater than a sum of the inner diameter R of the conductive through hole and a maximum allowable displacement amount Y.

3. The method for manufacturing the multilayer substrate for having the BGA-type component thereon according to claim 2, wherein
    the diameter D of the circular light-shielding portion of the photo mask is equal to or greater than a sum of the inner diameter R of the conductive through hole, the maximum allowable displacement amount Y and a maximum amount of light diffusion α, considering an amount of the light diffusion in a layer of the applied resist in the applying.

4. A method for manufacturing a multilayer substrate for having a BGA-type component thereon, the method comprising:
    forming a plurality of lands to which the BGA-type component is soldered in an aligned state at a front surface portion of a base that has an insulation property;
    forming a plurality of conductive through holes for restricting a signal interference to pass through the base from a front surface to a rear surface between the lands by forming a plurality of through holes in the base and then forming a plating with a predetermined thickness on each of the through holes; and
    forming a resist film to cover a portion of the front surface portion of the base other than the lands and the conductive through holes, wherein
    the forming of the resist film includes:
    applying a photosensitive resist to an entirety of the front surface portion of the base;
    exposing and hardening the resist in a state where a photo mask that shields a portion where the resist film is not formed is disposed adjacent to the front surface of the base; and
    washing to remove an unhardened portion of the resist, wherein
    the photo mask has a circular light-shielding portion covering a front surface portion of each of the conductive through holes, and
    the circular light-shielding portion has a diameter D that allows a diameter S of an opening portion of the resist film at the front surface portion of the conductive through hole to be equal to or less than an inner diameter R0 of the through hole.

5. The method for manufacturing the multilayer substrate for having the BGA-type component thereon according to claim 4, the method comprising:
    forming a rear surface resist film that covers a portion other than the conductive through holes on a non-mounting surface of the base on which the BGA-type component is not mounted, wherein
    the forming of the rear surface resist film includes:
    applying the photosensitive resist on an entirety of the non-mounting surface of the base;
    exposing and hardening the resist in a state where a rear surface photo mask that shields a portion where the rear surface resist film is not formed is disposed adjacent to the non-mounting surface of the base; and
    washing to remove an unhardened portion of the resist, wherein
    the rear surface photo mask has a circular light-shielding portion covering each of the conductive through holes with a diameter D' that allows a diameter S' of an opening portion of the rear surface resist film to be greater than the inner diameter R0 of the through hole by 150 μm or more.

6. The method for manufacturing the multilayer substrate for having the BGA-type component thereon according to claim 4, wherein
    the resist film is formed so that a distance c between adjacent conductive portions exposed at the front surface portion of the base is equal to or greater than 200 μm.

* * * * *